United States Patent
Tutunaru (10) Patent No.: US 10,819,191 B2
(45) Date of Patent: Oct. 27, 2020

(54) ELECTRICAL POWER GENERATING UNIT

(71) Applicant: Stanley Motors Inc., Scarborough, ME (US)

(72) Inventor: Catalin Tutunaru, Cape Elizabeth, ME (US)

(73) Assignee: Stanley Motors Inc., Scarborough, ME (US)

( * ) Notice: Subject to any disclaimer, the term of this patent is extended or adjusted under 35 U.S.C. 154(b) by 0 days.

(21) Appl. No.: 16/269,002

(22) Filed: Feb. 6, 2019

(65) Prior Publication Data

US 2019/0245413 A1    Aug. 8, 2019

Related U.S. Application Data

(60) Provisional application No. 62/627,096, filed on Feb. 6, 2018.

(51) Int. Cl.
| | | |
|---|---|---|
| *H02K 11/00* | (2016.01) | |
| *H02K 3/04* | (2006.01) | |
| *H02K 5/00* | (2006.01) | |
| *H01G 11/62* | (2013.01) | |
| *H01G 11/24* | (2013.01) | |

(Continued)

(52) U.S. Cl.
CPC ......... *H02K 11/0094* (2013.01); *H01G 11/08* (2013.01); *H01G 11/24* (2013.01); *H01G 11/30* (2013.01); *H01G 11/52* (2013.01); *H01G 11/62* (2013.01); *H01G 11/84* (2013.01); *H02K 3/04* (2013.01); *H02K 5/00* (2013.01);

(Continued)

(58) Field of Classification Search
CPC ........ H02K 11/0094; H02K 5/00; H02K 3/04; H02K 99/10; H02K 53/00; H01G 11/62; H01G 11/84; H01G 11/24; H01G 11/30; H01G 11/08; H01G 11/52; H02N 10/00; H02N 11/00
USPC ........................................ 310/305, 306, 307
See application file for complete search history.

(56) References Cited

U.S. PATENT DOCUMENTS 8,872,610 B2 * 10/2014 Inaba .................... H01F 27/306
                                                                336/96
2009/0315414 A1 * 12/2009 Shikayama ............ H02K 41/03
                                                              310/12.29

(Continued)

FOREIGN PATENT DOCUMENTS

EP        1 770 715 A1    4/2007

OTHER PUBLICATIONS

Bornholdt, T, My First Magrav, Kesche Foundation Danmark English Manual, 2015.*

(Continued)

*Primary Examiner* — John K Kim
(74) *Attorney, Agent, or Firm* — Law Offices of Daniel A. Tesler, LLC (57) ABSTRACT

The present disclosure is an electrical power generating and storage unit configured to generate electricity using magnetic forces and gravitational forces. The power generator can be scaled for various applications, including mobile and stationary power production. One example of the power generator includes nano-coated coils placed along the walls of a cylindrical housing around a centrally placed sphere containing a gel compound. The gel compound is produced by an electrochemical reaction between metals and a salt contained in a supersolution.

4 Claims, 5 Drawing Sheets

(51) Int. Cl.
  *H01G 11/30* (2013.01)
  *H01G 11/08* (2013.01)
  *H01G 11/52* (2013.01)
  *H01G 11/84* (2013.01)
  *H02N 11/00* (2006.01)
  *H02K 53/00* (2006.01)
  *H02K 99/00* (2014.01)
  *H02N 10/00* (2006.01)

(52) U.S. Cl.
  CPC ............. *H02K 53/00* (2013.01); *H02K 99/10* (2016.11); *H02N 10/00* (2013.01); *H02N 11/00* (2013.01)

(56) References Cited

U.S. PATENT DOCUMENTS

| | | | | |
|---|---|---|---|---|
| 2010/0009224 A1* | 1/2010 | Ku | ..................... | H01M 8/0656 429/412 |
| 2013/0107580 A1* | 5/2013 | Inaba | ..................... | H01F 27/306 363/16 |
| 2017/0271697 A1* | 9/2017 | Moon | ..................... | H01M 4/881 |
| 2018/0269511 A1* | 9/2018 | Togo | ..................... | H01M 8/04186 |
| 2019/0229318 A1* | 7/2019 | Xiao | ..................... | H01M 4/133 |
| 2019/0245413 A1* | 8/2019 | Tutunaru | ............... | H01G 11/52 |

OTHER PUBLICATIONS

International Search Report and Written Opinion received in Corresponding PCT Application, PCT/US19/16827, dated Jul. 10, 2019; 11 pages.

Bornholdt, T. 'My First Magrav Kesche Foundation Danmark English Manual 2015 Version 1'.PDF [online]. 2015 [retrieved Apr. 29, 2019]. Retrieved from the Internet: <URL: https://cdn.instructables.com/ORIG/FP3/0BSD/IHDUPKN3/FP30BSDIHDUPKN3.pdf>, entire document.

Harmlawf, I. 'Breakthrough Mobile Clean Eternal Constant Free Energy Technologies'. Website [online]. 2017 [retrieved Apr. 29, 2019]. Retrieved from the Internet: <URL: http://www.loris-hemlof.com/free.html>; pp. 13, 33, 56.

Pinantan001. 'Car Magrav assembly and install'. You Tube [Online]. Oct. 5, 2016 [retrieved Apr. 29, 2019]. Retrieved from the Internet: <URL: https://www.youtube.com/watch?v=hOcjAP7og3M>, entire video.

* cited by examiner

ELECTRICAL POWER GENERATING UNIT

CROSS REFERENCE TO RELATED APPLICATIONS

This application claims the benefit of U.S. Provisional Patent Application No. 62/627,096 filed Feb. 6, 2018, which is hereby incorporated by reference in its entirety.

FIELD OF THE INVENTION

The present disclosure relates to electrical power generation and storage and, in particular, to electrical power generation and storage using magnetic flow and gravitational flow.

BACKGROUND OF THE INVENTION

There has been significant investment and research into the field of electrical power generation and storage, but there are still many limitations as to the efficiency of the existing systems. Electrical power generation systems can be more efficient and emit fewer pollutants into the atmosphere. Electrical storage systems could also be more efficient, have a higher power density and a lower unit cost.

Specifically, there has been significant investment and research into the field of electric vehicles, however, the existing battery and battery charging systems only allow for vehicles with a limited range and/or a limited recharging rate. The existing batteries used for vehicle propulsion limit the range of a vehicle because they lack an energy density that is close to that of a fossil fuel. The existing batteries also take a significant amount of time to recharge, leaving a user stranded while the batteries recharge. When rapid recharging systems are used on the existing batteries, they tend to degrade battery life.

To extend the range of electric vehicles, many have sought to add a fossil fuel powered electrical generator to slowly recharge the onboard batteries while in use. This does extend range, but the burning of fossil fuels offsets the benefits of using an electric propulsion system. Therefore, there is a need for a system that extends the range of electric vehicles without the use of fossil fuels.

There is also an ever-increasing need for electricity to provide power to fixed structures. The current power grid system uses a combination of coal, natural gas and nuclear power to generate electricity. Each of these methods have limitations regarding their environmental impact and safety. Alternative energy generation systems, including solar and wind powered generators, exist in the prior art, but they are not particularly efficient and rely on the occurrence of a natural phenomenon to generate power (light or wind). The reliance of a natural phenomenon makes the use of the existing alternative energy generation systems unreliable and can create peaks and dips in the level of power generated. Therefore, there is a need for a power generation system that creates electricity without the environmental or safety concerns of traditional power generation systems or the peaks and dips in power generation characteristic of alternative power generation systems.

BRIEF SUMMARY OF THE INVENTION

The present disclosure is an electrical power generator that reacts with ambient magnetic forces and gravitational forces to generate electricity. The power generator can be used to generate power for any application that requires or stores electrical power. Possible applications include power generation for fixed structures and the system of vehicle propulsion disclosed herein. The electrical power generator disclosed herein can also be adapted for use in power production plants, portable or non-portable generators or scaled in size for a predetermined amount of power generation. Some embodiments of the power generator create electrical power through ion transfer, magnetic flow, gravitational flow and/or interaction with electromagnetic flux.

The embodiment presented in this application is optimized for use in a vehicle propulsion system, however, it is appreciated that the disclosure could be scaled for use in other applications within the inventive concept expressed herein. The electrical power generator can also be used as a stand-alone device to provide electrical power or to charge a storage battery system.

DETAILED DESCRIPTION OF THE INVENTION

Figure 1:
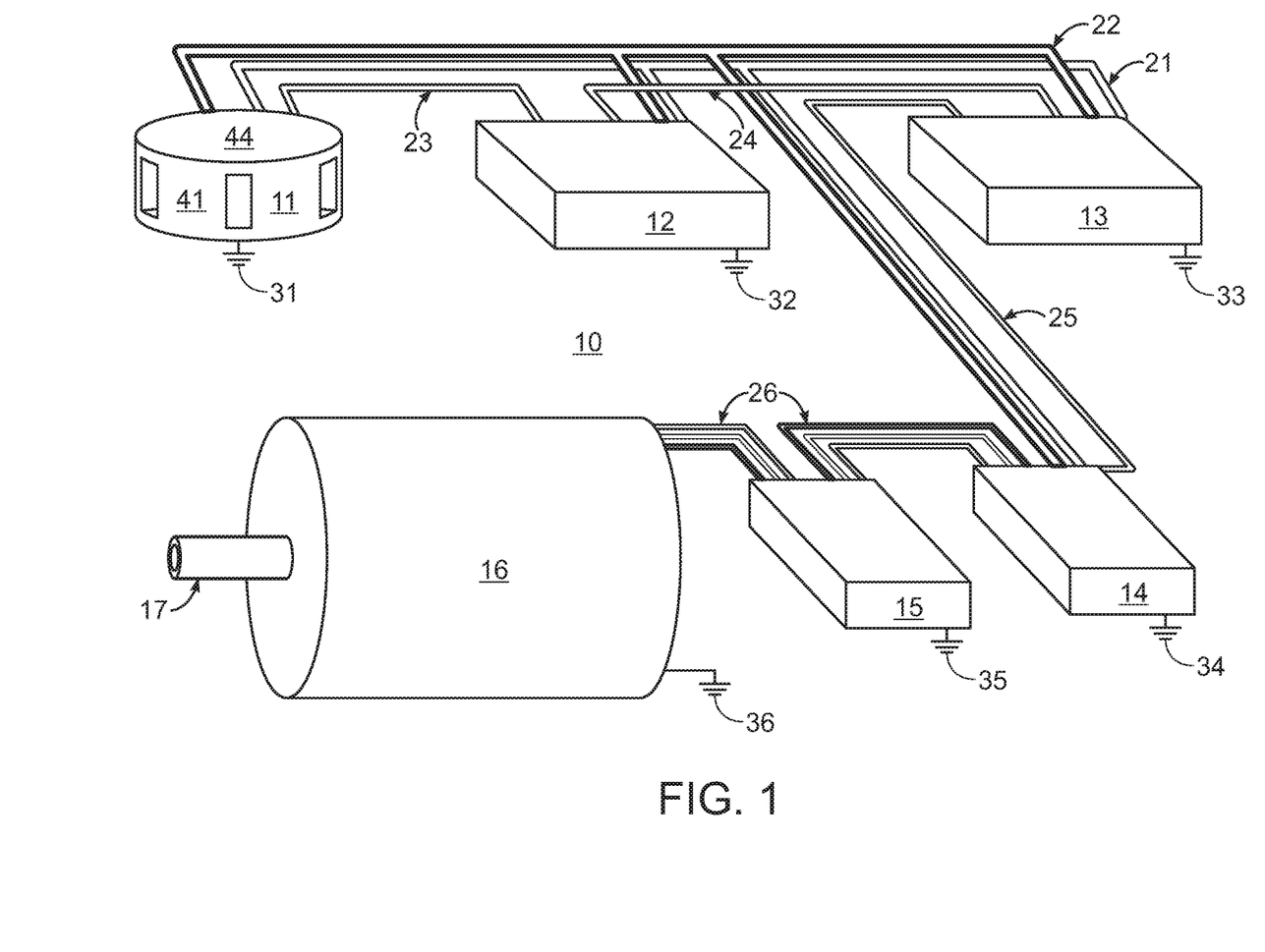
FIG. 1 is a system diagram of an exemplary vehicle propulsion system incorporating the power generator of the present disclosure.

In FIG. 1 is a system diagram of an exemplary vehicle propulsion system 10 incorporating the power generator 11 of the present disclosure. While the power generator 11 is presented as a component within a vehicle propulsion system 10, those skilled in the art will understand how it could be adapted to other applications.

The power generator 11 is connected to a super capacitor pack 12 by a positive electrical connection 21, a negative electrical connection 22 and a communication connection 23. The communication connection 23 is electrically connected to the power generator controller 60. The power generator 11 is also grounded through ground connection 31. In this embodiment, the power generator 11 is generally cylindrical in shape with a substantially flat top 44 and a circumferential outer wall 41. The top panel 44 preferably allows the passage of atmospheric air from outside of the power generator 11 in and out of the power generator 11. The passage of air can be allowed through the use of a vent on the power generator 11 or any other suitable conduit for the free passage of air.

The super capacitor pack 12 is preferably comprised of one or more super capacitors to provide an adequate amount of capacity for the vehicle propulsion system 10. In this embodiment, three super capacitors are used, each with a capacity of approximately 2 Farads. The number and/or capacity of the super capacitors may be modified to suit the power needs of the vehicle propulsion system 10. In some embodiments, the super capacitor pack 12 comprises 6-10 super capacitors. The super capacitor pack 12 preferably is sized to accept the maximum amount of power capable of being generated by the power generator 11. The power being generated by the power generator 11 can be configured to be temporarily stored in the super capacitor pack 12 until it can be transferred to a battery pack through a charge controller.

The super capacitor pack 12 can be connected to a battery pack 13 by a positive electrical connection 21, a negative electrical connection 22 and a communication connection 24. The super capacitor pack 12 can also connect to an inverter 14 by a positive electrical connection 21 and negative electrical connection 22. The super capacitor pack 12 can also be grounded through a ground connection 32. The battery pack 13 can be used to provide initial power to the vehicle propulsion system 10 while the power generator 11 begins to accumulate power in the super capacitor pack 12. The battery pack 13 can be connected to the inverter 14 by a positive electrical connection 21, a negative electrical connection 22 and a communication connection 25. The battery pack 13 can also be grounded through a ground connection 33. The communication connection 25 can be comprised of a CAN bus line commonly used for transmitting data in a vehicle.

The electrical power generated by the power generator 11 and stored in the super capacitor pack 12 and battery pack 13 can be either direct current (hereinafter "DC") or alternating current (hereinafter "AC"). In cases where the battery pack 13 is DC and the motor is AC, an inverter 14 can be used to convert DC power to AC power. The inverter 14 can transmit three-phase AC power to a motor controller 15 over a three-phase power circuit 26. The inverter 14 can also be grounded through a ground connection 34. The motor controller 15 transmits three-phase AC power to an electric motor 16 over the three-phase power circuit, causing the output shaft 17 of the electric motor 16 to rotate and provide vehicle propulsion. The motor controller can also be grounded through a ground connection 35 and the electric motor 16 can be grounded through a ground connection 36.

Figure 2:
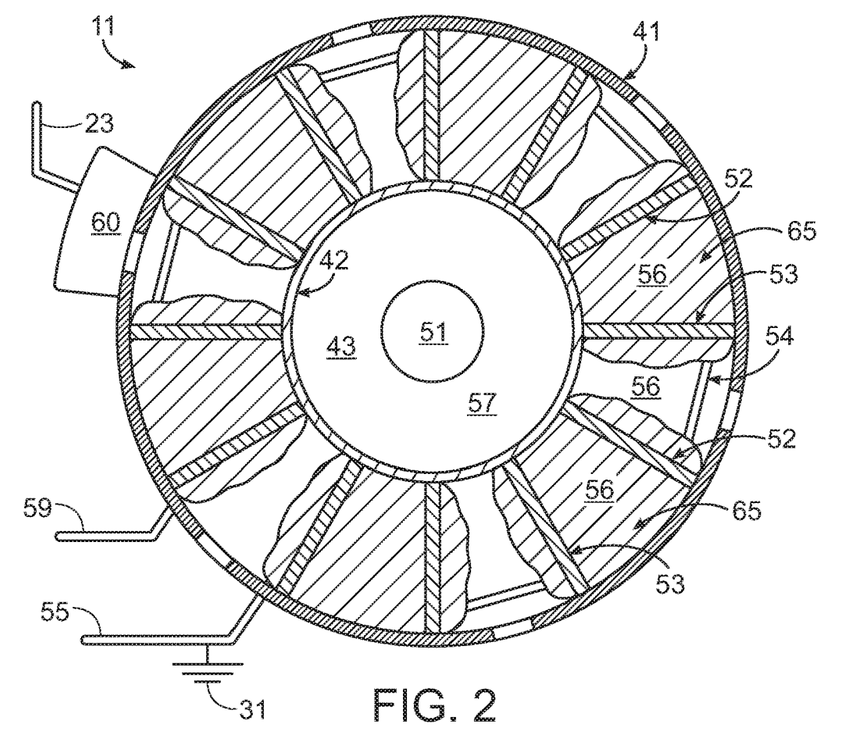
FIG. 2 is a top sectioned view of the power generator.

In FIG. 2 is a top sectioned view of the power generator 11 where it has been sectioned horizontally through its vertical center. The exemplary embodiment of the power generator 11 can be configured to produce AC or DC electrical power. In examples where a DC power generator 11 is used to power an AC load, a DC to AC converter can be used. The power generator 11 is contained in a housing comprised of a bottom panel 43 a circumferential wall 41 and a top panel 44. Within the housing is a cylindrical inner wall 42, separating the interior of the housing into two spaces, an inner space 57 and an outer space 56 that is circumferentially located about the inner space 57. The power generator housing is preferably comprised of a nonconductive material, however, it could be comprised of a conductive material with a nonconductive coating or insulators to prevent undesired electrical connections.

At the center of the inner space 57, mounted to the bottom panel 43 is a magnet 51 configured to provide magnetic flux in the outer space 56. Magnetic fields can impact the drift and diffusion rate of ions in some embodiments. In some embodiments, the magnetic field guide and/or accelerate the flow of ions. The magnet 51 is preferably oriented so that the positive pole or south pole faces upward and the negative pole or north pole faces downward to provide the proper orientation for the magnetic flux. The magnet 51 is preferably cylindrical in shape to provide an equal amount of magnetic flux within the housing at equal distances from the center. In some embodiments, a magnet of about 1.5 inches tall and about 2.5 inches in diameter is preferably used. In some embodiments, it can be preferable to mount the magnet 51 about 0.5 to 1 inch above the bottom panel 43. While a cylindrical magnet 51 has been disclosed, magnets of other shapes can be used if positioned to balance the magnetic flux. The magnet 51 is selected to provide a certain amount of magnetic flux based on the size and number of first plates 53 and second plates 52. In some embodiments, the magnet 51 comprises Neodymium or an alloy thereof. In some embodiments, the magnet 51 comprises Neodymium, Iron and Boron. In some embodiments, the magnet 51 comprises Neodymium, Iron and Boron and has a magnetic induction greater than 1,000 gauss. In some embodiments, the magnet 51 comprises Neodymium, Iron and Boron and has a magnetic induction between and including 5,000 gauss and 15,000 gauss. In some embodiments, the magnet 51 comprises Neodymium, Iron and Boron and has a magnetic induction of about 10,000 gauss.

In some embodiments, the first plates 53 are comprised of Copper or an alloy thereof. In some embodiments, the second plates 52 are comprised of Zinc or an alloy thereof. In other embodiments, the second plates 52 are comprised of a Copper alloy, such as brass or bronze. In some embodiments, the plates 52 & 53 can be comprised of other nonferrous metals or an alloy thereof.

In the outer space 56 is a series of equally spaced first plates 53 and second plates 52 that have been pretreated with a nano-coating and a gel solution. The first plates 53 and second plates 52 are preferably first nano-coated with an oxide layer. The oxide layer can be applied using a heat source. If the nano-coating is applied with a heat source, a torch with a nozzle of about 1.0 inch to 1.5 inches is preferable. Propane is an appropriate fuel source for applying the nano-coating layer, however, when using a propane torch, care much be taken because the flame from a propane fueled nozzle is greater than the melting point of Zinc. The nano-coating is preferably completed in atmospheric conditions to provide an adequate amount of Oxygen and Nitrogen to produce the nano-coating.

The nano-coating is preferably applied by heat cycling the surface of the first plates 53 and second plates 52 multiple times. The surfaces may be heat cycled, using a propane torch as few as two times and as many as 50 times. It is preferable to heat cycle each planar surface of the first plates 53 and second plates 52 between and including 5 times to 15 times. It is most preferable to heat cycle the surface of the first plates 53 and second plates 52 about 10 times. The heat cycling preferably heats the surface of the first plates 53, when the first plates comprise Copper, to about 3,300 to 3,600 degrees Fahrenheit. The heat cycling preferably heats the surface of the second plates 52, when the second plates comprise Zinc, to about 1,500 degrees Fahrenheit. The first plates 53 and second plates 52 preferably should be allowed to cool to room temperature after each heat cycle.

The nano-coating process preferably applies an oxide layer of about 2.0 microns. The nano-coating oxide layer on the first plates 53, when comprising Copper, is preferably CuO. In some embodiments, the nano-coating oxide layer on the first plates 53, when comprising Copper, can be $Cu_2O$, $CuO_2$ or $Cu_2O_3$. The nano-coating oxide layer on the second plates 52, when comprising Zinc, is preferably ZnO. In some embodiments, the nano-coating oxide layer can include compounds in addition to those listed above due to environmental contaminants or to make minor modifications to the nano-coating within the inventive concept expressed herein.

The gel compound is created by creating a supersolution of deionized water and Sodium Chloride (NaCl) and suspending a first plate 53 and second plate 52 within separate batches of the solution. In some embodiments, NaCl may be substituted with Magnesium Sulfate ($MgSO_4$) or other compounds with similar properties. The supersolution can be a solution of about 11-21% NaCl by volume and 79-89% deionized water by volume. The supersolution is preferably a solution of about 14-18% NaCl by volume and 82-86% deionized water by volume. The super solution is preferably created by stirring the solution about two to three times per day over a period of about two weeks. The super solution generally becomes somewhat clear when the NaCl or $MgSO_4$ is fully dissolved in the deionized water.

Some embodiments use a super solution containing a concentration of $MgSO_4$ of greater than about 5% $MgSO_4$ by volume. The super solution can be created by dissolving the requisite volume of $MgSO_4$ into the requisite volume of deionized water. When $MgSO_4$ is used to create the super solution, it is preferably commercially pure to prevent contaminants in the gel compound. If a NaCl is used in the solution, the type of NaCl used is preferably purified sea salt, however, other types of purified NaCl can perform adequately.

Over a period of time, the super solution and plates 52 and 53 form a gel compound. A single first plate 53 and second plate 52 are preferably electrically connected to one another with an electrical conduit, such as a Copper wire, and submerged in the super solution for a period of time. The electrical conduit connecting the first plate 53 and second plate 52 is preferably nano-coated in the method disclosed herein. The amount of time that the first plates 53 and second plates 52 must be submerged in the super solution to create the gel compound depends on the temperature of the solution and the concentration of NaCl or $MgSO_4$ in the solution. The amount of time necessary is generally about one week to four weeks. The plates are preferably placed in the super solution so that they are spaced away from the bottom of the container holding the super solution and extending partially above the surface of the super solution. For example, in an embodiment that uses first plates 53 and second plates 52 of about five inches by seven inches by 0.06 inches, a container of about 12 inches wide, by 8 inches wide and 7 inches deep and holding about 3.5 liters of the super solution would be ideal, allowing the plates to be spaced about one inch from the bottom of the container and extending about one inch above the surface of the super solution.

Over the period of time where a first plate 53 and second plate 52 are submerged in the super solution, the super solution has an electrochemical reaction between the metallic content of the plates 52 and 53 and the NaCl or $MgSO_4$ of the super solution. Over the period of time, a gel compound 65 forms in the space around the first plates 53 and second plates 53. The gel compound 65 can be further purified to minimize contaminants through a washing process. The washing process can include removing the plates 52 and 53 from the container, allowing the gel compound to fall to the bottom of the container and then removing the supersolution above the gel compound. The gel compound can then be transferred to a new container with fresh deionized water and the washing process repeated. In some embodiments, the washing process is repeated about 5-15 times to ensure the purity of the gel compound. It is preferable for the washing process to be repeated about 10 times to ensure the purity of the gel compound.

Once the first plates 53 and the second plates 52 have been nano-coated and covered with the gel compound described above, they can be inserted into the outer space 56 and fixed in position. The first plates 53 and second plates 52 are preferably oriented so that their planar direction is in the radial direction of the outer space 56, so that the plates are an equal distance apart (measured on the inner wall 42 or outer wall 41) and alternate in material. Two first plates 53 and two second plates 52 are identified in FIG. 2 to show their alternating configuration. Once positioned in the housing, the first plates 53 and second plates 52 are electrically connected to their adjacent plates at their base by a lower connection 54. The first plates 53 and second plates 52 are also electrically connected to their adjacent plates by an upper connection 58. While a lower connection 54 and an upper connection 58 are disclosed, they can optionally be replaced by a single electrical connection. The lower connections 54 and upper connections 58 preferably comprise a spiraled Palladium wire that has been nano-coated through a similar process as the first plates 53 and second plates 52. After the first plates 53 and second plates 52 have been fixed in the housing, the space between each pair of first plates 53 and second plates 52 is preferably filled with the gel compound 65. The outer wall 41 preferably includes an opening or cut-out in the area between each pair of first plates 53 and second plates 52 to allow the flow of atmospheric air into the power generator 11.

Figure 3:
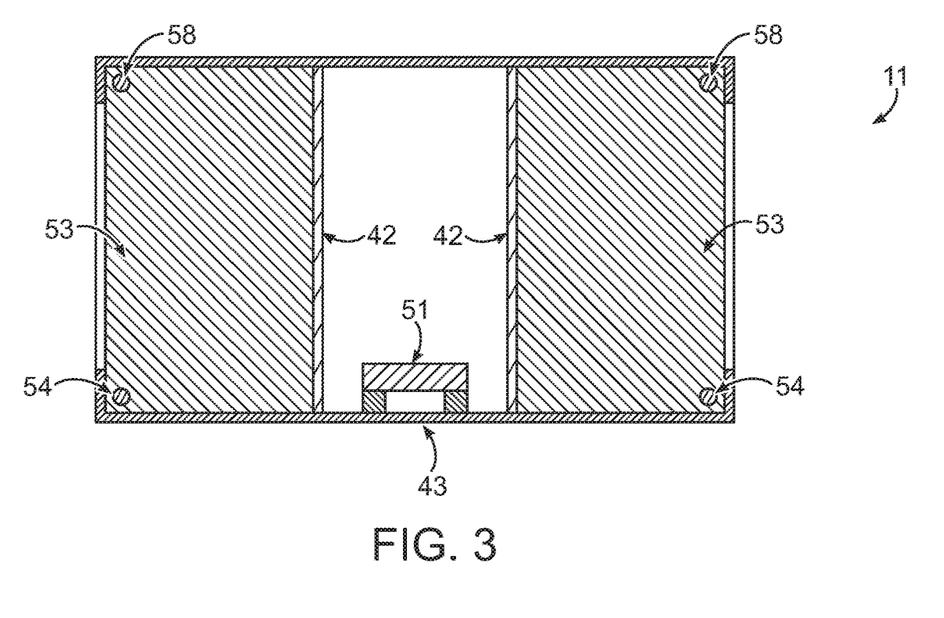
FIG. 3 is a side sectioned view of the power generator.

In. FIG. 3 is a side sectioned view of the power generator 11 showing the configuration of the lower connection 54 wires. The first plates 53 and second plates 52 are also electrically connected to their adjacent plates at their top by an upper connection 58. One first plate 53 and one second plate 53 is preferably not connected to one another using a lower connection 54 or upper connection 58. Rather, one first plate 53 can be connected to one second plate 53 on one side and a positive electrode 59 on another side, and one second plate 52 can be connected to one first plate 53 on one side and a negative electrode 55 on another side. The negative electrode 55 can be connected to a system ground 31 in some embodiments.

The bottom panel 43 of the housing is preferably slightly conical in shape and convex so that the vertex of the cone faces downward. The height of the cone is preferably two to four millimeters to move the base of the magnet 51 below the base of the first plates 53 and second plates 52. In one embodiment, the height of the cone is about three millimeters. In some embodiments, the height of the cone is about half a millimeter to ten millimeters.

The first plates 53 and second plates 52 can be a homogenous thickness or a varied thickness to change the rate of the chemical reaction. The thickness of the gel compound 65 is preferably about 1.5 times the thickness of the first plates 53 or second plates 52 on both planar surfaces. For instance, if the plate is 1.0 mm thick, the gel compound 65 would preferably be 1.5 mm on either side of the plate, creating a plate and gel compound 65 assembly that is 4.0 mm thick. In some embodiments, the plates are about 1.0 to 1.4 mm thick. In other embodiments, the plates are about 0.5 to 5.0 mm thick. The thickness of the plates can be scaled, depending on the anticipated power output requirements of the power generator 11. In some embodiments, the gel compound 65 thickness on each planar surface of the plates is between 1.3 to 1.7 times the thickness of the plates. In other embodiments, the gel compound 65 thickness on each planar surface of the plates is between 0.75 to 4.0 times the thickness of the plates.

In the embodiment disclosed in FIGS. 1-3, the power generator 11 uses six first plates 53 and six second plates 52, however, more or fewer plates can be used to adjust the rate of power generation and the expected lifespan of the power generator 11. In some embodiments, the first plates 53 and second plates 52 may be spaced as closely together, at their closest distance, as one third of the thickness of the gel compound 65. For example, if the gel compound 65 is 2.0 mm, the plates can be placed 0.67 mm from an adjacent plate. Because of the circular configuration of the plates, the closest distance between the plates is measured near the inner wall 42. In some embodiments, the first plates 53 and second plates 52 may be spaced as closely together as one half of the thickness of the gel compound 65.

Each pair of first plates 53 and second plates 52 with a gel compound layer 65 between them produces electrical energy. One first plate 53, when comprising Copper, acts as a cation selective electrode and one second plate 52, when comprising Zinc, acts as an anion selective electrode. Since each pair of first plates 53 and second plates 52 are also electrically connected through a lower connection 54 and an upper connection 58, an electrical current is produced along the lower connection 54 and upper connection 58 as the first plates 53 and second plates 52 shed ions to maintain their electro-neutrality. Each pair of first plates 53 and second plates 52 is electrically connected to an adjacent pair of first plates 53 and second plates 52 to create a circuit in series that terminates at a positive electrode 59 and a negative electrode 55. In some embodiments, it may be preferably to connect the pairs of first plates 53 and second plates 52 in parallel or a combination of series and parallel to achieve a desired voltage.

Figure 4:
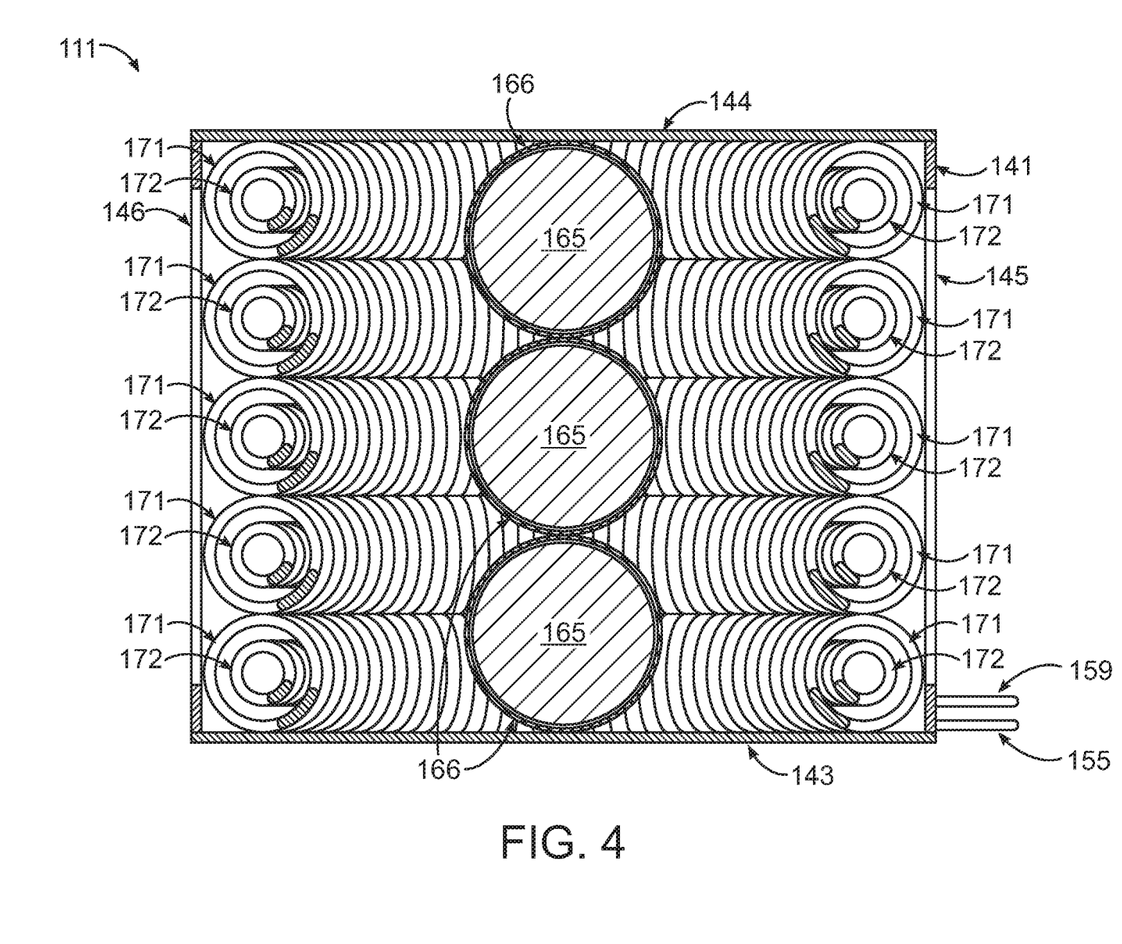
FIG. 4 is a side sectioned view of an alternative embodiment of the power generator.
Figure 5:
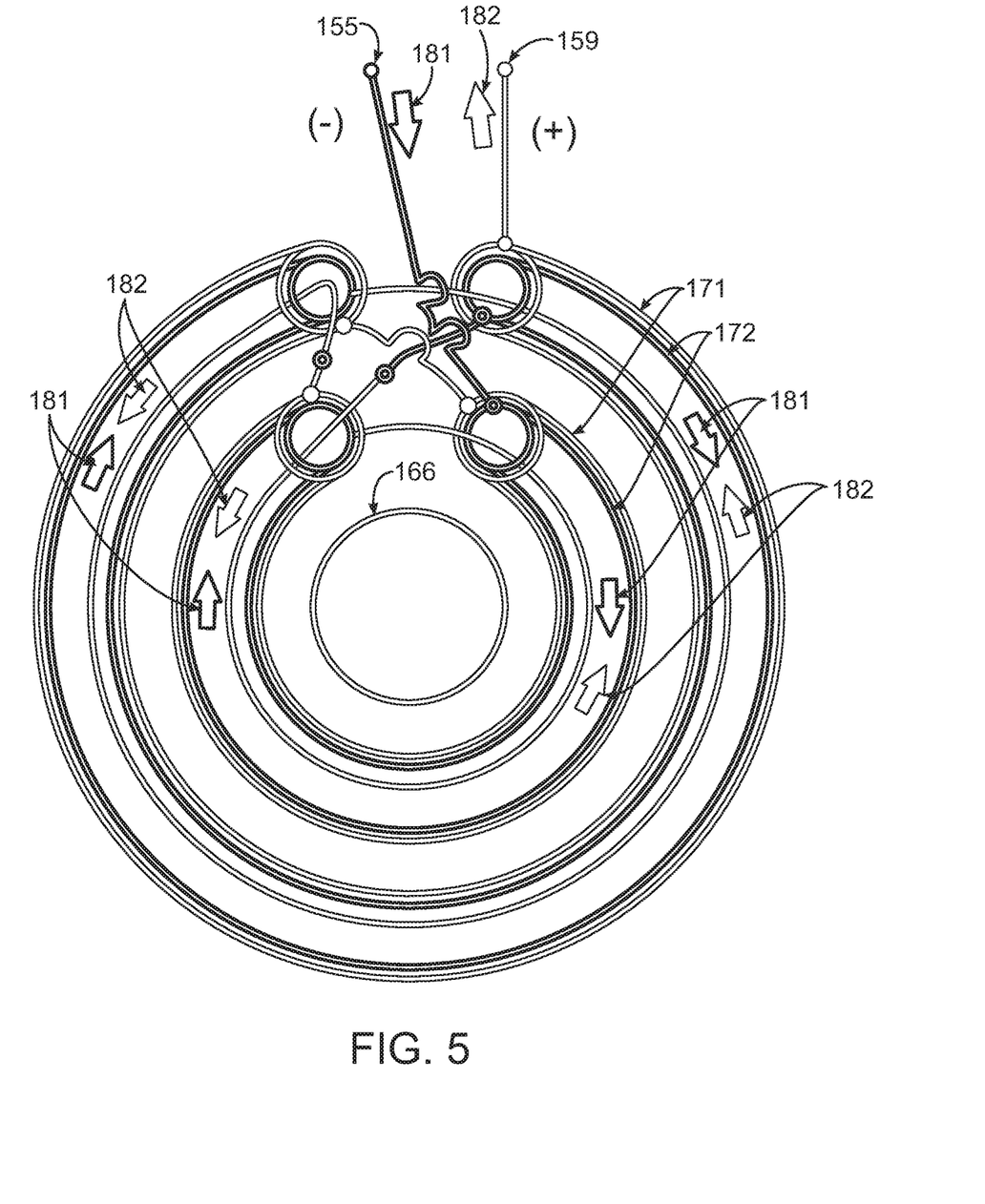
FIG. 5 is a diagram showing the flow of magnetic flow and gravitational flow in the alternative embodiment.

In FIGS. 4 and 5 is an alternative embodiment of a power generator 111 comprising a series coils 171 and 172 and gel-compound 165 filled balls 166. In FIG. 4 is a side sectioned view of the power generator 111 sectioned vertically down the center of the power generator 111. The power generator 111 can be constructed in a housing comprising a circumferential wall 141, a bottom panel 143 and a top panel 144, forming a substantially cylindrical housing. The circumferential wall 141, in some embodiments, can include a plurality of openings 145 and 146 that can provide ventilation to the components inside the housing.

The power generator 111 comprises multiple sets of outer coils 171 and inner coils 172 lining the inner surface of the circumferential wall 141. The outer coils 171 can be fixed at least partially along the inner surface of the circumferential wall 141. The coils 171 and 172 preferably comprise an electrically conductive metallic material. The coils 171 and 172 are preferably a commercially pure copper wire, such as a United Numbering System (UNS) grade C11000 to C130000.

The coils 171 and 172 in the power generator 111 are preferably nano-coated using the process described earlier and coated with the gel-compound 65 produced in the method disclosed herein. The coils 171 and 172 can be nano-coated by heat cycling the surface of the coils 171 and 172 about 5 to 15 times to about 3,300 to 3,600 degrees Fahrenheit. The coils 171 and 172 preferably should be allowed to cool to room temperature after each heat cycle.

The nano-coating process preferably applies an oxide layer to the coils 171 and 172 of about 2.0 microns. The nano-coating oxide layer on the coils 171 and 172 is preferably CuO. In some embodiments, the nano-coating oxide layer on the coils 171 and 172 can be $Cu_2O$, $CuO_2$ or $Cu_2O_3$. In some embodiments, the nano-coating oxide layer can include compounds in addition to those listed above due to environmental contaminants or to make minor modifications to the nano-coating within the inventive concept expressed herein.

Once nano-coated, the coils 171 and 172 are preferably coated in the gel-compound 65 produced in the method disclosed herein and then allowed to dry. The gel-compound 65 is the product of an electrochemical reaction between the metallic content of the plates 52 and 53 and the NaCl or $MgSO_4$ of the super solution. The coils 171 and 172 are preferably coated in the gel-compound 65 and dried 5-15 times. The coils 171 and 172, comprising a nano-coating and a dried gel-compound 65 coating, are then configured along the inner surface of the circumferential wall 141 so that inner coil 172 is placed within the outer coil 171. The term "within," as used herein, refers to the inner coil 172 being substantially within an area defined by the wire of the outer coil 171. The coils 171 and 172 can comprise a wire wound in a coil shape so that the resulting coil shape defines a shape and volume. The inner coil 172 has a shape and volume that substantially fits within the shape and volume of the outer coil 171 in some embodiments.

At the center of the power generator 111 is at least one ball 166 containing a gel-compound 165. The power generator 111 in FIG. 4 has 3 balls 166 due to the number of coils 171 and 172. The balls 166 can comprise a plastic or polymers (natural or synthetic). In some embodiments, the gel-compound 165 is the same as the gel-compound 65 described herein. In some embodiments, the gel-compound 165 is the product of an electrochemical reaction between the metallic content of plates 52 and 53 and NaCl of a super solution. In some embodiments, the gel-compound 165 is the product of an electrochemical reaction between the metallic content of plates 52 and 53 and $MgSO_4$ of a super solution.

The balls 166 containing the gel-compound 165 are not necessarily electrically connected to the coils 171 and 172, but instead, they guide the magnetic flow and gravitational flow to generate electricity. In some embodiments, the magnetic flow and gravitational flow originate from the Earth. The coils 171 and 172 are configured and wired according to FIG. 5. When configured according to FIG. 5, the magnetic flow moves in the directions indicated by the arrows 182 and the gravitational flow moves in the directions indicated by the arrows 181. The coils 171 and 172 can be configured to have a positive electrode 159 and a negative electrode 155. The electrode polarities are exemplary and can be configured in the reverse of the embodiments presented.

Magnetic and gravitational waves are collected by the power generator 111 due to the unique nano and gel 165 coated coils 171 and 172, exciting the coil windings. The gel 165 itself attracts and responds to magnetic and gravitational waves. The nano and gel 165 coated coils are a focused attractor and concentrator to generate electricity. In some respects, the power generator 111 acts simultaneously an antenna and as a static generator.

When the power generator 111 is first assembled as disclosed herein, it can be configured to provide either AC or DC power and polarity. To start the power generation process, the power generator 111 must undergo an initiation process by passing an electrical current through the coils 171 and 172 and placing a load inline with the current to prevent damage to the coils 171 and 172. If an AC current is passed through the coils 171 and 172 with an AC load placed inline, the power generator 111 would be configured to produce AC power. The initiation process preferably lasts for a predetermined period of time where an electrical current is passed through the coils 171 and 172 with an electrical load placed inline and for a predetermined period of time where the coils 171 and 172 power the electrical load without an outside electrical current source. In some embodiments, the electrical power can pass through a bank of super capacitors between the coils 171 and 172 and the electrical load.

The power generator 111 disclosed herein can be sized to power, for example, a motor vehicle. In a motor vehicle application, it could be beneficial to use a power generator 111 with a power output of at least 2.0 kWh. The figures disclosed herein can be configured to build a power generator with a power output of 2-5 kWh. The figures disclosed herein can also be scaled to build a power generator with a power generator with a power output of less than 2 kWh or more than 5 kWh.

Figure 6:
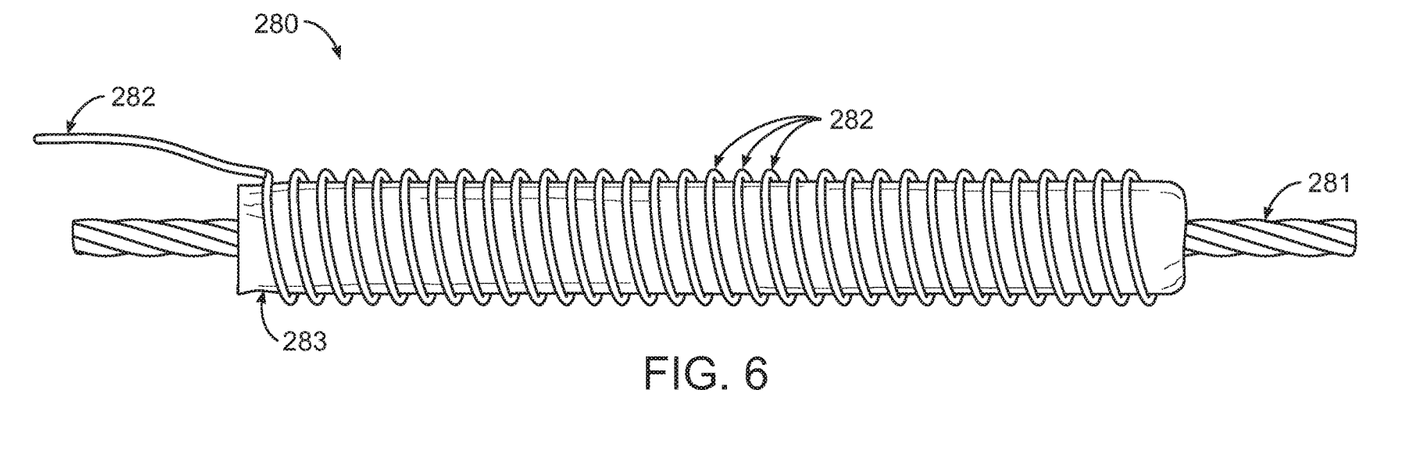
FIG. 6 is a side view of a super capacitor disclosed herein.
Figure 7:
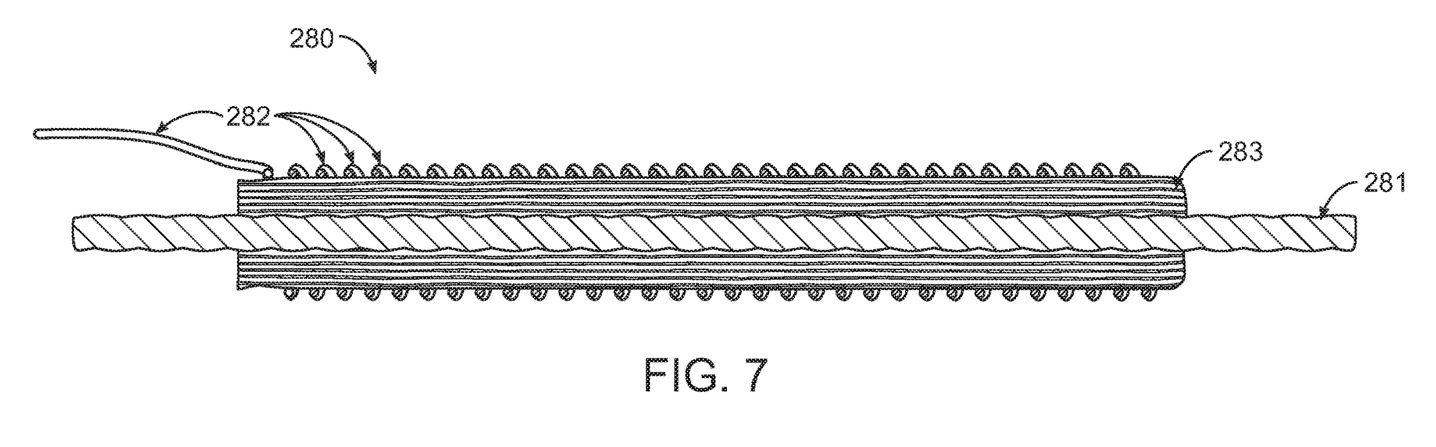
FIG. 7 is a side sectioned view of the super capacitor showing the internal construction.

In FIGS. 6 and 7 is a super capacitor constructed with the methods and components described herein. The super capacitor 280 comprises a core 281, a separator 283 and a coil 282. The core 281 can be any heavy gauge electrically conductive metallic material, such as stranded copper wire, a copper rod, a metallic stranded wire or a metallic rod. The coil 282 comprises an electrically conductive metallic material, such as a copper wire or a metallic wire. The core 281 and coil 282 are preferably a commercially pure copper wire, such as UNS grade C11000 to C130000. In some embodiments, the core 281 and coil 282 comprise wires, where the core has a wire gauge about 2-8 times a wire gauge of the coil 282.

The core 281 and coil 282 are preferably nano-coated using the process described earlier. The core 281 and coil 282 can be nano-coated by heat cycling the surface of the core 281 and coil 282 about 5 to 15 times to about 3,300 to 3,600 degrees Fahrenheit. The core and coil 282 preferably should be allowed to cool to room temperature after each heat cycle.

The nano-coating process preferably applies an oxide layer to the core 281 and coil 282 of about 2.0 microns. The nano-coating oxide layer on the core 281 coil 282 is preferably CuO. In some embodiments, the nano-coating oxide layer on the core 281 and coil 282 can be $Cu_2O$, $CuO_2$ or $Cu_2O_3$. In some embodiments, the nano-coating oxide layer can include compounds in addition to those listed above due to environmental contaminants or to make minor modifications to the nano-coating within the inventive concept expressed herein.

The separator 283 comprises a layer of paper and a layer of aluminum foil fixed to one another and rolled around the core 281. The separator 283 is created by coating the layer of paper and the layer of aluminum foil with the gel-compound 65 on both sides and allowing the material to dry. The gel-compound 65 is the product of an electrochemical reaction between the metallic content of the plates 52 and 53 and the NaCl or $MgSO_4$ of the super solution. The layer of paper and the layer of aluminum foil are then coated with a titanate powder. The combined layer of paper and layer of aluminum are then rolled around the core 281 to form the separator 283.

The super capacitor 280 disclosed herein has the advantage of being much lighter and smaller than other super capacitors known in the art. The super capacitor pack 12 in FIG. 1, in some embodiments, comprises one or more super capacitors 280.

While the power generators 11 and 111 have been disclosed and described as a stand-alone power generation and storage system, as well as part of an exemplary vehicle propulsion system 10, it can also be used to generate power for a fixed structure. The electrical power generator disclosed herein can also be adapted for use in power production plants, portable or non-portable generators or scaled in size for a predetermined amount of power generation.

What has been described is an electrical power generating and storage unit and an electrical power generating and storage unit incorporated in an exemplary system of vehicle propulsion. While this disclosure shows a power generator within a vehicle propulsion system, all or part of the disclosure is capable of being used in other applications. In this disclosure, there is shown and described only the preferred embodiments, but, as aforementioned, it is to be understood that the disclosure is capable of use in various other combinations and environments and is capable of changes or modifications within the scope of the inventive concept as expressed herein.

The invention claimed is:

1. An electrical power generator, comprising:
   a housing defining a generally cylindrical internal space;
   an outer coil fixed at least partially along an edge of the internal space, wherein the outer coil defines a coil internal space;
   an inner coil, wherein the inner coil is at least partially disposed within the coil internal space; and
   a sphere fixed within the internal space;
   wherein:
      the housing comprises a plurality of openings; and
      the sphere contains a gel-compound produced by an electrochemical reaction between a metallic substance and a salt contained in a solution;
   wherein the gel compound comprises an electrochemical reaction between a supersolution containing a first plate electrically connected to a second plate; and
   wherein the supersolution comprises about 14-18% NaCl by volume and 82-86% deionized water by volume.

2. The electrical power generator of claim 1, wherein the first plate comprises copper and a nano-coating.

3. The electrical power generator of claim 2, wherein the second plate comprises zinc and a nano-coating; wherein the electrical connection between the first and second plates comprises a nano-coated wire.

4. An electrical power generator, comprising:
   a housing defining a generally cylindrical internal space;
   an outer coil fixed at least partially along an edge of the internal space, wherein the outer coil defines a coil internal space;
   an inner coil, wherein the inner coil is at least partially disposed within the coil internal space; and
   a sphere fixed within the internal space;
   wherein:
      the housing comprises a plurality of openings; and
      the sphere contains a gel-compound produced by an electrochemical reaction between a metallic substance and a salt contained in a solution;
   wherein the gel compound comprises an electrochemical reaction between a supersolution containing a first plate electrically connected to a second plate; and
   wherein the supersolution comprises about 14-18% $MgSO_4$ by volume and 82-86% deionized water by volume.

* * * * *